US012701953B2

(12) United States Patent
    Umeoka

(10) Patent No.: US 12,701,953 B2
(45) Date of Patent: Aug. 4, 2026

(54) SUBSTRATE TREATMENT APPARATUS WITH VIRTUAL DUMMY WAFER FUNCTION AND SUBSTRATE TREATMENT METHOD

(71) Applicant: ASM IP Holding B.V., Almere (NL)

(72) Inventor: Yoshiyuki Umeoka, Fuchu (JP)

(73) Assignee: ASM IP Holding B.V., Almere (NL)

( * ) Notice: Subject to any disclaimer, the term of this patent is extended or adjusted under 35 U.S.C. 154(b) by 871 days.

(21) Appl. No.: 17/736,502

(22) Filed: May 4, 2022

(65) Prior Publication Data

US 2022/0359246 A1    Nov. 10, 2022

Related U.S. Application Data

(60) Provisional application No. 63/185,943, filed on May 7, 2021.

(51) Int. Cl.

| | |
|---|---|
| *H10P 72/00* | (2026.01) |
| *C23C 16/455* | (2006.01) |
| *C23C 16/458* | (2006.01) |
| *C23C 16/46* | (2006.01) |
| *C23C 16/50* | (2006.01) |
| *C23C 16/52* | (2006.01) |
| *C23C 16/54* | (2006.01) |
| *C23C 16/56* | (2006.01) |
| *H10P 72/30* | (2026.01) |
| *H10P 72/76* | (2026.01) |
| *H10P 74/00* | (2026.01) |

(52) U.S. Cl.
CPC .... *H10P 72/0612* (2026.01); *C23C 16/45525* (2013.01); *C23C 16/45536* (2013.01); *C23C 16/4583* (2013.01); *C23C 16/46* (2013.01); *C23C 16/50* (2013.01); *C23C 16/52* (2013.01); *C23C 16/54* (2013.01); *C23C 16/56* (2013.01); *H10P 72/0436* (2026.01); *H10P 72/3304* (2026.01); *H10P 72/7602* (2026.01); *H10P 72/7612* (2026.01); *H10P 74/23* (2026.01)

(58) Field of Classification Search
None
See application file for complete search history.

(56) References Cited

U.S. PATENT DOCUMENTS

| | | | |
|---|---|---|---|
| 10,618,085 B2 | 4/2020 | Cheng et al. | |
| 11,342,216 B2 | 5/2022 | Liu et al. | |
| 2008/0092813 A1* | 4/2008 | Nakashima | G03F 7/162 |
| | | | 118/712 |
| 2009/0229634 A1* | 9/2009 | Nomura | H10P 72/0612 |
| | | | 134/18 |

(Continued)

*Primary Examiner* — Karla A Moore

(74) *Attorney, Agent, or Firm* — Snell & Wilmer L.L.P.

(57) ABSTRACT

Examples of a substrate treatment apparatus includes a chamber, a substrate support stage located inside the chamber, an elevation device that moves the substrate support stage up and down, a gate valve provided between the chamber and an adjacent chamber that is adjacent to the chamber, and a chamber state controller including a processor and a memory configured to cause the processor to execute a program stored in the memory, or including a dedicated circuitry, to move the elevation device and the gate valve before a next substrate treatment is performed in the chamber, in a state in which no substrate is present in the chamber.

12 Claims, 7 Drawing Sheets

(56)         References Cited

U.S. PATENT DOCUMENTS

| | | | |
|---|---|---|---|
| 2009/0263961 A1* | 10/2009 | Kher | C23C 16/45582 |
| | | | 257/E21.159 |
| 2010/0080671 A1* | 4/2010 | Okuno | H01L 21/67253 |
| | | | 414/161 |
| 2016/0307784 A1* | 10/2016 | Gomi | H01L 21/67745 |
| 2017/0178939 A1 | 6/2017 | Omori | |
| 2017/0314128 A1 | 11/2017 | Kang | |
| 2020/0185257 A1 | 6/2020 | Nishiwaki | |
| 2020/0216961 A1 | 7/2020 | Nomura et al. | |

* cited by examiner

DUMMY PRE-RECIPE — S41

SUS AND GV MOVEMENTS — S42

DUMMY MAIN-RECIPE — S43

SUS AND GV MOVEMENTS — S44

DUMMY POST-RECIPE — S45

SUBSTRATE TREATMENT APPARATUS WITH VIRTUAL DUMMY WAFER FUNCTION AND SUBSTRATE TREATMENT METHOD

CROSS-REFERENCE TO RELATED APPLICATIONS

This application claims the benefit of U.S. Provisional Application No. 63/185,943, filed on May 7, 2021, in the United States Patent and Trademark Office, the disclosure of which is incorporated herein in its entirety by reference.

FIELD

Examples are described which relate to a substrate treatment apparatus and a substrate treatment method.

BACKGROUND

When a job is executed from an idle state in which a process chamber is not operating, a wafer to be treated firstly is treated in a state in which the state of the chamber is not completely prepared, and accordingly a difference in qualities of treatment is caused between a wafer to be treated firstly and wafers to be treated thereafter. In order to reduce this difference, it is necessary to treat the wafer after having prepared the state of the chamber in advance.

SUMMARY

Some examples described herein may address the above-described problems. Some examples described herein may provide a substrate treatment apparatus and a substrate treatment method that can prepare the state of the chamber before an actual wafer is introduced into the chamber, and reduce or avoid a difference in treatment quality occurring due to a treatment order of the wafer.

In some examples, a substrate treatment apparatus includes a chamber, a substrate support stage located inside the chamber, an elevation device that moves the substrate support stage up and down, a gate valve provided between the chamber and an adjacent chamber that is adjacent to the chamber, and a chamber state controller including a processor and a memory configured to cause the processor to execute a program stored in the memory, or including a dedicated circuitry, to move the elevation device and the gate valve before a next substrate treatment is performed in the chamber, in a state in which no substrate is present in the chamber.

DETAILED DESCRIPTION

Figure 1:
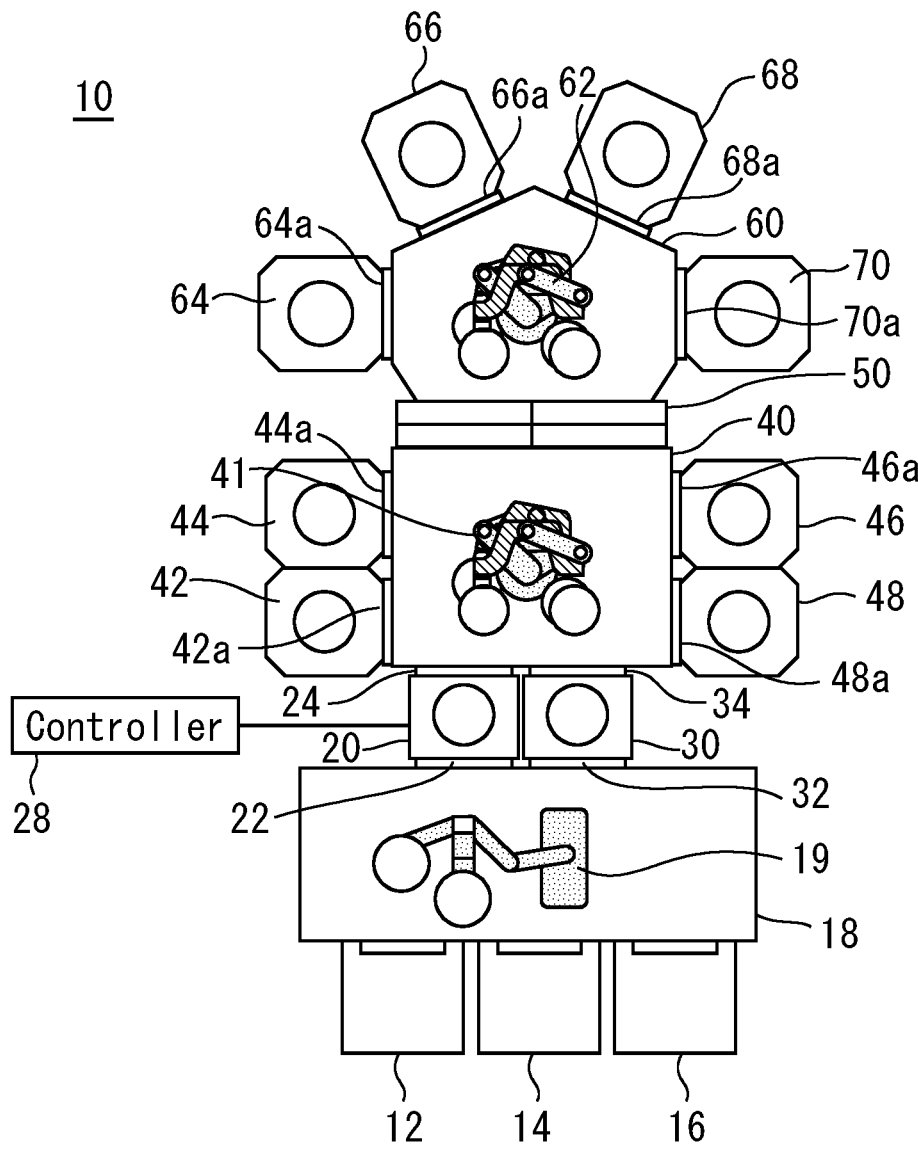
FIG. 1 is a view showing a configuration example of a substrate treatment apparatus.

The substrate treatment apparatus and the substrate treatment method will be described below with reference to the drawings. The same or corresponding constituent components are designated by the same reference numerals, and repeated description thereof is omitted in some cases.
Embodiment
FIG. 1 is a view showing a configuration example of a substrate treatment apparatus 10. This substrate treatment apparatus 10 includes a plurality of load ports. In the example of FIG. 1, there are provided load ports 12, 14 and 16. Here, the number of load ports is set at three, but may be two or four or more. A front-end module 18 is provided adjacent to the plurality of load ports 12, 14 and 16. The front-end module 18 includes a Fan Filter Unit (FFU), for example, and is provided so as to transfer a substrate under atmospheric pressure. There is a first wafer transfer device 19 in the front-end module 18. According to one example, the first wafer transfer device 19 is a robot for transferring the wafer. The load ports 12, 14 and 16, the front-end module 18 and the first wafer transfer device 19 are collectively referred to as an Equipment Front End Module (EFEM) or enclosure.
A first load lock chamber (first LLC) 20 and a second load lock chamber (second LLC) 30 are provided adjacent to the front-end module 18. The first LLC 20 and the second LLC 30 are connected to a vacuum device, and can be set to atmospheric pressure or to a vacuum. According to one example, the first LLC 20 and the second LLC 30 are two independent chambers, and the movement of gas from one to the other is prevented. For information, in FIG. 1, two load lock chambers are provided, but three or more load lock chambers may be provided.
A gate valve 22 is provided between the first LLC 20 and the front-end module (FEM) 18. A gate valve 32 is provided between the second LLC 30 and the FEM 18.
A wafer handling chamber (WHC) 40 is provided adjacent to the first LLC 20 and the second LLC 30. There is a second wafer transfer device 41 in the WHC 40. According to one example, the second wafer transfer device 41 is a robot for transferring the wafer. A gate valve 24 is provided between the first LLC 20 and the WHC 40. A gate valve 34 is provided between the second LLC 30 and the WHC 40. Reactor chambers 42, 44, 46 and 48 are adjacent to the WHC 40 via gate valves 42a, 44a, 46a and 48a, respectively.
The WHC 40 is in contact with the WHC 60 via a pass-through chamber 50. According to one example, the pass-through chamber 50 includes an upper pass-through chamber having a gate valve on the WHC 60 side, and a lower pass-through chamber having a gate valve on the WHC 40 side. In other words, in the upper pass-through chamber and also in the lower pass-through chamber, there is one gate valve between the WHC 40 and the WHC 60. Thereby, the pressures of the WHC 40 and the WHC 60 can be made different from each other. A third wafer transfer device 62 is provided in the WHC 60. According to one example, each of the second wafer transfer device 41 and the third wafer transfer device 62 has perpendicularly arranged two arms. According to another example, the number of arms can be any number.

Reactor chambers 64, 66, 68 and 70 are adjacent to the WHC 60 via gate valves 64a, 66a, 68a and 70a, respectively. According to one example, the reactor chamber 42 44, 46 and 48 and the reactor chambers 64, 66, 68 and 70 can be provided as apparatuses for forming an epitaxial growth film on the wafer by single-wafer treatment.

A controller 28 controls substrate transport and substrate treatment in the substrate treatment apparatus. According to one example, the controller 28 manages a job list, issues a command for transport of the wafer, and issues a command for wafer treatment. For information, the wafer can be transported along a transport path of the wafer, which has been designated by a control job.

The substrate treatment apparatus 10 of FIG. 1 can be configured differently. According to one example, the pass-through chamber 50, WHC 60 and reactor chambers 64, 66, 68 and 70 may be omitted. According to another example, the reactor chamber for single-wafer treatment can be replaced by a Dual Chamber Module (DCM) or a Quad Chamber Module (QCM), or replaced by another batch treatment chamber.

Figure 2:
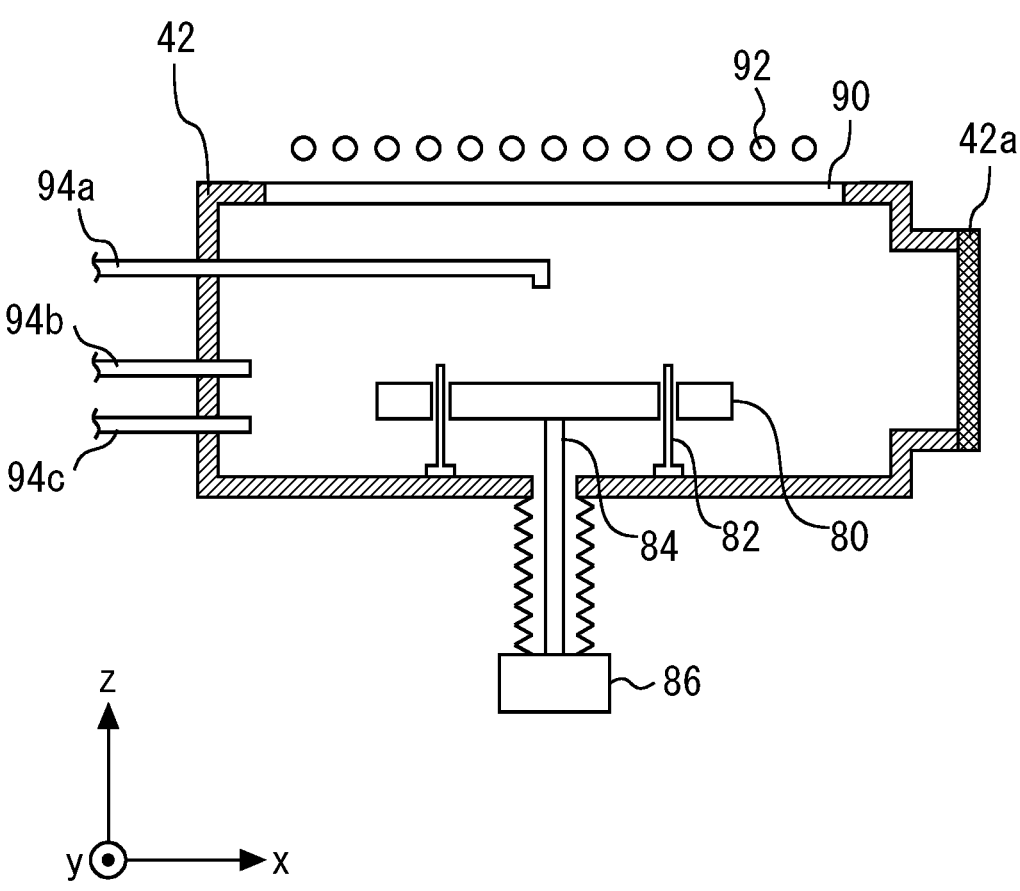
FIG. 2 shows a configuration example of a reactor chamber.

FIG. 2 is a cross-sectional view showing a configuration example of a reactor chamber. There is a substrate support stage 80 in the reactor chamber 42. According to one example, the substrate support stage 80 is a susceptor provided with a temperature raising device for raising a temperature of a substrate. According to another example, such temperature raising can be omitted. The substrate support stage 80 is supported by a shaft 84. The shaft 84 and the substrate support stage 80 can be moved up and down by an elevation device 86. According to one example, the elevation device 86 also has a function of rotating the substrate support stage 80.

A susceptor pin 82 is fixed to a bottom face of the reactor chamber 42. At least three susceptor pins 82 can be provided in one reactor chamber 42. When the substrate support stage 80 descends, the susceptor pin 82 protrudes from the upper surface of the substrate support stage 80. In this state, a substrate can be provided on the susceptor pins 82 by the second wafer transport device 41, for example. As the substrate support stage 80 descends, the upper ends of the susceptor pins 82 are positioned below the upper surface of the substrate support stage 80, and the substrate is held by the substrate support stage 80.

A raw material supply line 94a, an auxiliary gas supply line 94b, and an exhaust line 94c are connected to the reactor chamber 42. The raw material supply line 94a is a line which supplies a liquid raw material to the wafer therethrough. The auxiliary gas supply line 94b is a line which supplies, for example, hydrogen gas into the chamber therethrough. The exhaust line 94c is a line which exhausts gas in the chamber therethrough. The raw material supply line 94a and the previously described elevation device 86 enable the spin coating which uniformly applies the liquid raw material to the substrate.

According to one example, a lamp heater 92 is provided above the reactor chamber 42. As the lamp heater 92, 24 xenon flash lamps, for example, can be arranged in a grid pattern or in parallel. A chamber window 90 is provided in the upper part of the reactor chamber 42. The chamber window 90 is formed from a material which transmits light of the lamp heater 92. The material of the chamber window 90 is, for example, quartz. Light emitted from the lamp heater 92 passes through the chamber window 90 and heats the substrate on the substrate support stage 80. As a heater for raising the temperature in the chamber, another heater than the lamp heater may be adopted. For example, it is also possible to provide a heater on an inner wall of the chamber, or provide a heater on the substrate support stage.

A gate valve 42a is provided on a side face of the reactor chamber 42. When the gate valve 42a is set at an open state, the substrate can be transported from one of the WHC 40 and the reactor chamber 42 to the other by use of the second wafer transport device 41. In this way, a gate valve can be provided between a chamber and an adjacent chamber which is adjacent to the chamber. It should be noted that, according to one example, the configuration of FIG. 2 can be applied to all the previously described reactor chambers.

This substrate treatment apparatus has a function called Virtual Dummy Wafer (VDW) for preparing the chamber state prior to substrate treatment in the reactor chamber. The VDW is executed according to the setting of a user.

Figure 3:
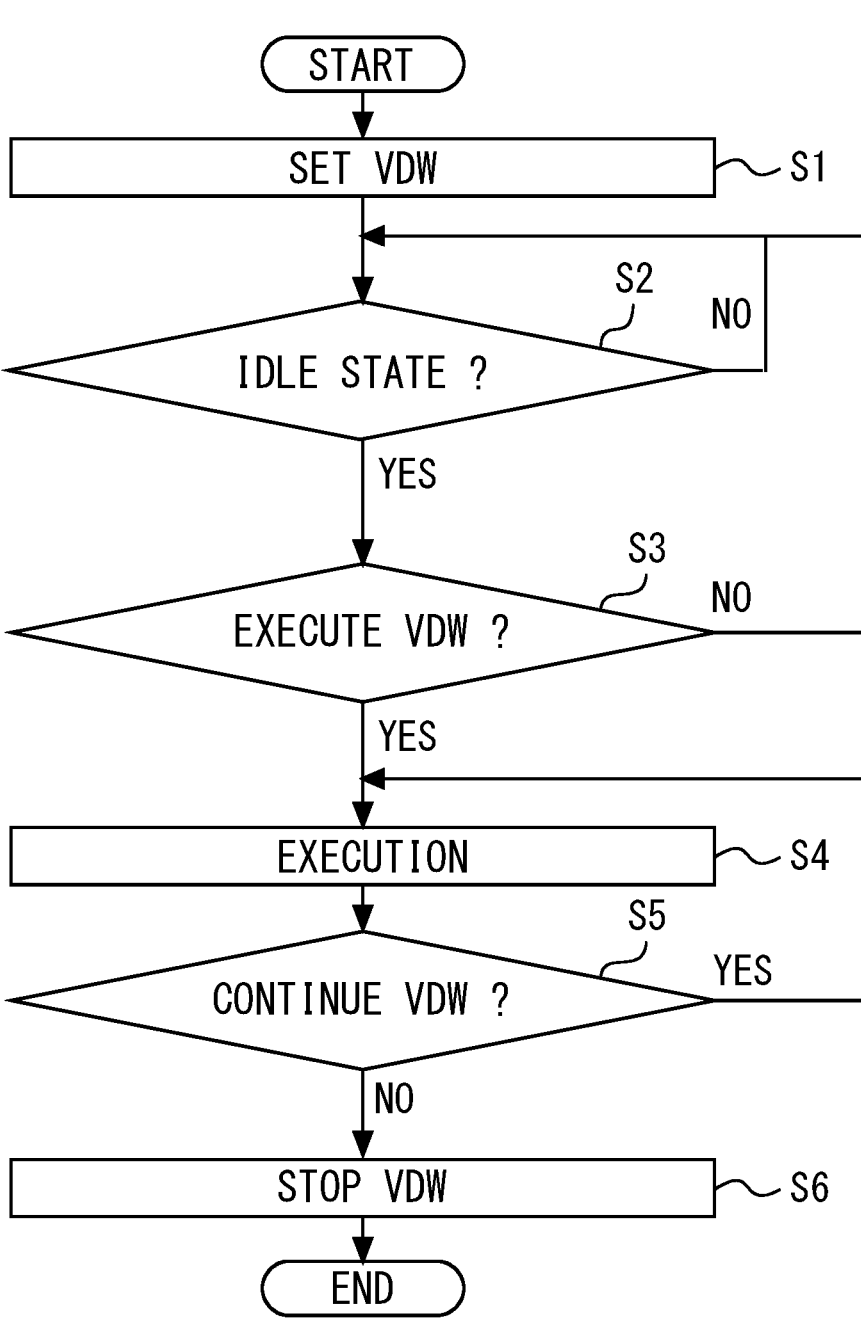
FIG. 3 is a flowchart relating to an example of use of the VDW.

FIG. 3 is a flowchart relating to an example of use of the VDW. Firstly, in step S1, the VDW is set in a process job. For example, the user sets a content of the VDW, and sets the use of the VDW, by a computer.

Next, the process proceeds to step S2. In step S2, the controller determines whether there is an idle state in which the substrate treatment is not performed in the chamber. For example, the controller monitors the job list to perform the determination. Usually, jobs are sequentially added to the job list, and the jobs are sequentially executed. The controller monitors the job list and detects when there will be no job which uses a certain chamber, or that there will be a vacant period of time between jobs. Then, in such a case, the controller determines that the chamber will enter the idle state. According to one example, the controller determines that the chamber is already in the idle state. According to another example, the controller determines that the chamber will enter an idle state in the future. When the idle state of the chamber is found in step S2, the process proceeds to step S3.

In step S3, the controller determines whether the idle state exceeds a predetermined period. When a period of the idle state of the chamber is short, the change in the state of the chamber due to the idle state is slight, and the controller does not execute the VDW. On the other hand, when the idle state exceeds the predetermined period, the state of the chamber greatly changes due to the idle state for a certain long period, and a difference occurs in the treatment quality between the wafer to be treated firstly and the wafers to be treated thereafter. In order to reduce or eliminate the difference, the controller determines the execution of the VDW. Here, the state of the chamber can be any element that gives influence on the wafer process. Specifically, at least one of the temperature, pressure and atmosphere of the chamber is included.

In this example, when it is determined that the idle state exceeds the predetermined period, the controller determines the execution of the VDW. According to another example, the controller can determine the execution of the VDW, and also determine the timing of the execution of the VDW, in step S3. The timing of the execution of the VDW can be adjusted so that the VDW ends right before the next substrate treatment is performed. Due to the VDW being implemented, the state of the chamber is prepared so as to be substantially the same as the state at the time of the process, and right after that, the treatment of the next substrate is started. According to one example, the VDW is used for chamber seasoning and thermal conditioning. Thereby, the qualities of the first substrate treatment and the second substrate treatment can be substantially equalized.

The steps S2 and S3 may not be processed in separate steps, but may be processed in one step. When it is determined in step S3 that the idle state exceeds the predetermined period, the process proceeds to step S4.

In step S4, the controller executes the VDW. According to one example, the VDW is a function of moving the elevation device and moving the gate valve, before the next substrate treatment is performed in the chamber, in a state in which no substrate is present in the chamber. The substrate support stage is moved up and down by the operation of the elevation device. By the opening and closing of the gate valve, for example, the chamber 42 and the WHC 40 are spatially connected to each other, or intercepted from each other.

According to one example, the controller 28 moves the elevation device and moves the gate valve in the "same way" as the movement of the elevation device associated with the next substrate treatment and the movement of the gate valve associated with the next substrate treatment, in a state in which no substrate is present in the chamber. Thereby, the state of the chamber can be brought close to a state of the chamber in the process state. For example, when the substrate support stage is moved, a gas which has stayed in a certain place in the chamber diffuses and the atmosphere approaches the atmosphere in the process state, or when the gate valve is opened and closed, the space of the chamber and the space of the WHC are connected to each other, and thereby, the temperature, the pressure or the atmosphere of the chamber approaches these respective elements in the process state.

Figure 4:
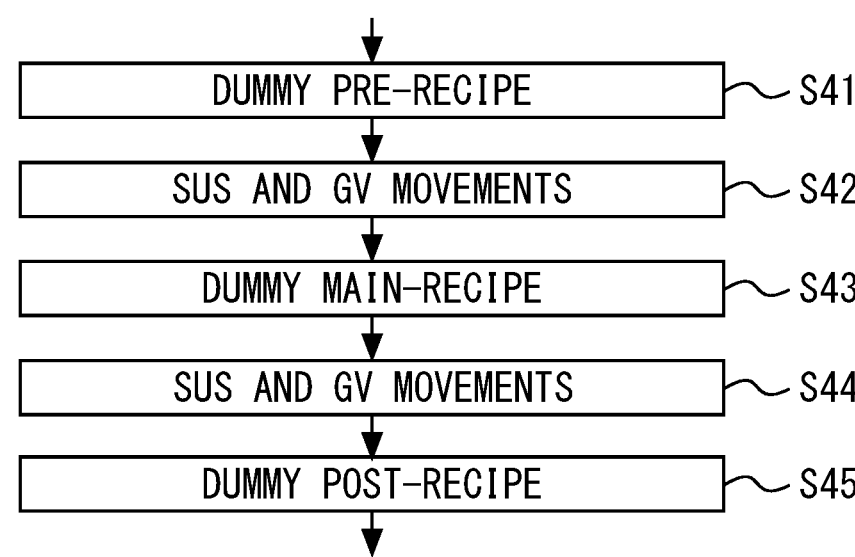
FIG. 4 is a flowchart showing a specific example of the VDW.

FIG. 4 is a flowchart showing a specific example of step S4. In the processing in this specific example, firstly, processing based on a dummy pre-recipe is performed in step S41. According to one example, the dummy pre-recipe is a recipe which causes a temperature of the chamber to approach a high temperature at the time of the process, prior to the substrate treatment. In other words, in this example, the pre-recipe is a recipe for pre-heating. According to another example, the dummy pre-recipe can have the same content as the pre-recipe used in the next substrate treatment. In this case, for example, the dummy pre-recipe can execute pre-coating treatment or cleaning treatment. The pre-coating is the treatment in which a thin film of $SiO_2$ or the like is deposited on the inner surface of the reaction chamber after cleaning, and products generated during cleaning are sealed.

Next, in step S42, the controller moves the elevation device and moves the gate valve, in a state in which no substrate is present in the chamber. According to one example, the movement of the elevation device and the gate valve can be matched with the movement at the time when the wafer is actually carried into the chamber.

Next, the process proceeds to step S43. In step S43, processing based on a dummy main recipe is performed. According to one example, it is possible to set the dummy main recipe to the same content as in the main recipe which is used in the next substrate treatment. For example, when the main recipe is a recipe which forms an epitaxial film on the substrate, the dummy main recipe is also a recipe having the similar content. In this example, in the execution of the dummy main recipe, the chamber is heated by, for example, the lamp heater, the liquid raw material is provided onto the substrate support stage, and the auxiliary gas is provided. According to another example, the dummy main recipe can have such a content that only the heating process in the main recipe has been extracted. In this case, the substrate support stage is heated by the execution of the dummy main recipe, but the liquid raw material, the auxiliary gas and the like are not supplied to the chamber.

Next, in step S44, the controller moves the elevation device and moves the gate valve, in a state in which no substrate is present in the chamber. According to one example, the movement of the elevation device and the gate valve can be matched with the movement at the time when the wafer is actually carried out from the chamber.

Next, in step S45, processing based on a dummy post-recipe is performed. According to one example, the dummy post-recipe can have the same content as the post-recipe which is used in the next substrate treatment. According to another example, the dummy post-recipe can be a content different from that of the post-recipe. In any case, the content of the dummy post-recipe can be set to cleaning treatment in the chamber after the treatment, an operation for maintaining the temperature in the chamber, or any other content.

In this way, the controller executes the VDW in the state in which no substrate is present in the chamber. According to one example, while the VDW is executed, it is prohibited to move the wafer transport robot in a state in which no wafer is present in the chamber. This is mainly a measure for preventing a breakdown of the transport robot.

When the processing of step S4 in FIG. 3 has been finished, the process proceeds to step S5 in FIG. 3. In step S5, the controller determines whether the VDW is continued. According to one example, it is determined whether or not the VDW is continued, on the basis of whether it has occurred, for example, that although it has been determined to execute the VDW twice in step S3, subsequently a new job of substrate treatment has entered, or a job of a scheduled substrate treatment has been cancelled. When a new job of substrate treatment has entered and a time period for performing the second VDW cannot be secured, it is determined that the VDW is not continued. On the other hand, when a job of the scheduled substrate treatment has been canceled, it is determined that the VDW is continued. When it is determined that the VDW is not continued, the VDW is stopped. In this way, the VDW can be executed a plurality of times. A plurality of executions of the VDW contributes to bringing the state of the chamber close to the state of the chamber at the time of the process.

After the end of the VDW, the substrate is treated on the basis of a process recipe having the pre-recipe, the main recipe and the post-recipe. The treatment by the main recipe can be, for example, epitaxial film formation, PECVD, PEALD or thermal ALD. A means for heating a substrate in the thermal ALD is, for example, a heater provided in or under the susceptor. This heater is referred to as a stage heater.

Figure 5:
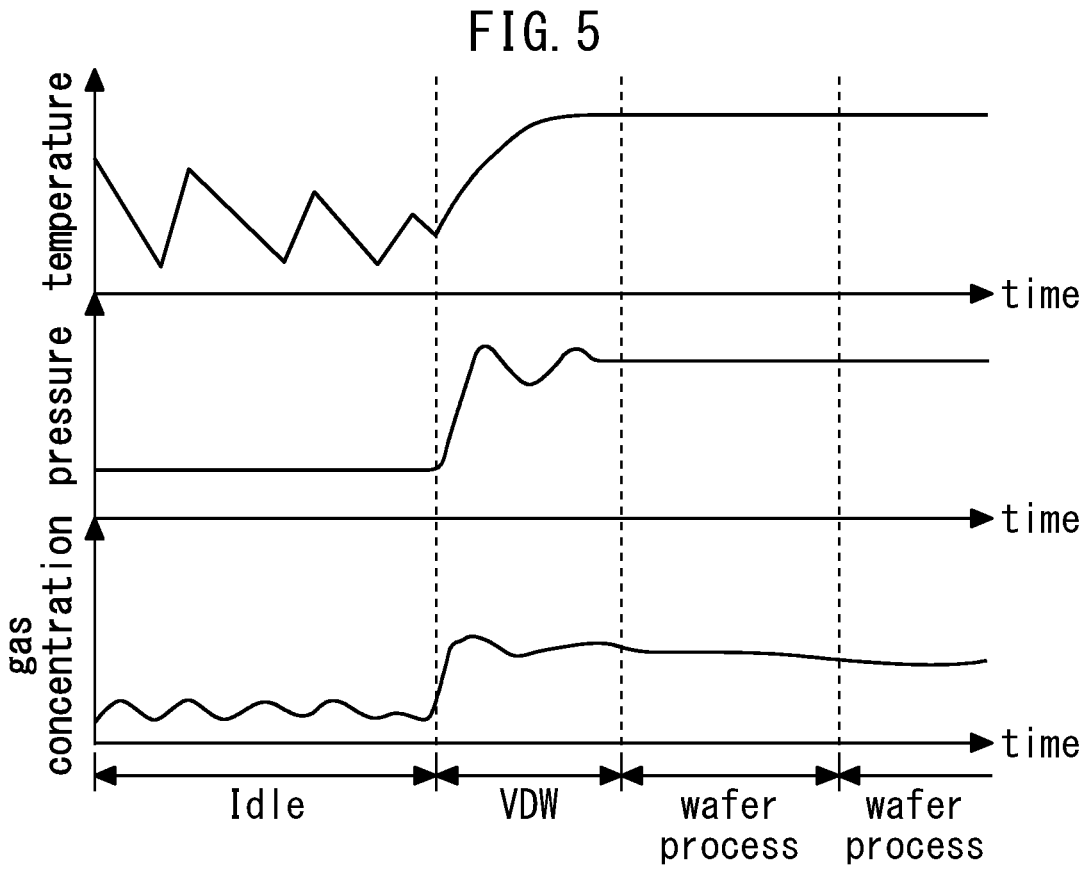
FIG. 5 shows an example of changes over time in temperature, pressure, and atmosphere in the chamber.

FIG. 5 is a diagram showing an example of changes over time in temperature, pressure and atmosphere in the chamber. In this example, in the idle state, the chamber is heated a plurality of times at an arbitrary timing, but the temperature drops with the passage of time. However, by the execution of the VDW, the chamber temperature is raised to the same temperature as that at the time of the wafer process, and the temperature difference between the first wafer process and the second and subsequent wafer processes can be reduced or eliminated.

Regarding the pressure, in this example, the pressure drops in the idle state because gas is not suppled. However, by the execution of the VDW, the pressure becomes substantially equal to that at the time of the wafer process, and the pressure difference between the first wafer process and the second and subsequent wafer processes can be reduced or eliminated.

Regarding the atmosphere, in this example, the gas concentration decreases in the idle state because the gas is not supplied. However, by the execution of the VDW, the atmosphere becomes equivalent to that at the time of the wafer process, and the atmosphere difference between the first wafer process and the second and subsequent wafer processes can be reduced or eliminated.

The transitions of temperature, pressure and atmosphere in FIG. 5 are illustrative. According to other examples, the factors follow other transitions, and thereby the state of the chamber in the first wafer process and the state of the chamber in the second and subsequent wafer processes can be substantially matched.

Figure 6:
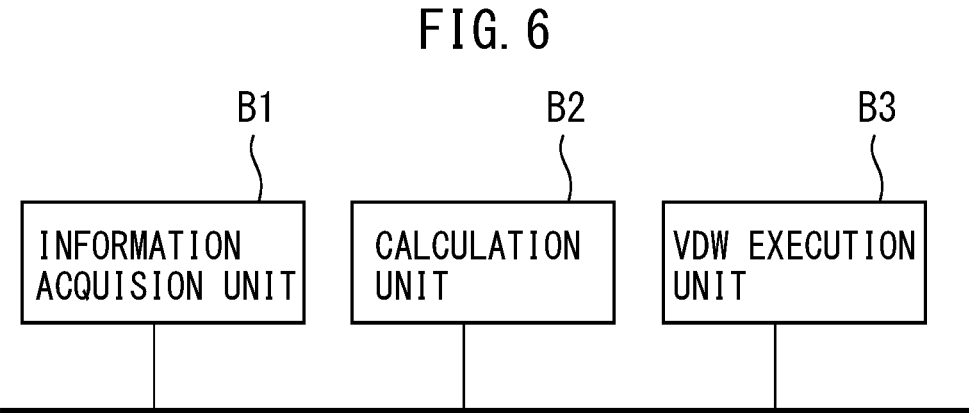
FIG. 6 is a functional block diagram of the controller.

FIG. 6 is a functional block diagram of processing by the above-described controller. An information acquisition unit B1 is a portion that acquires information of the job list, for example. A calculation unit B2 is a portion that executes the processing of steps S2, S4, S5 and S6 in FIG. 3. A VDW execution unit B3 is a portion that executes the processing of step S4 in FIG. 3.

Figure 7A:
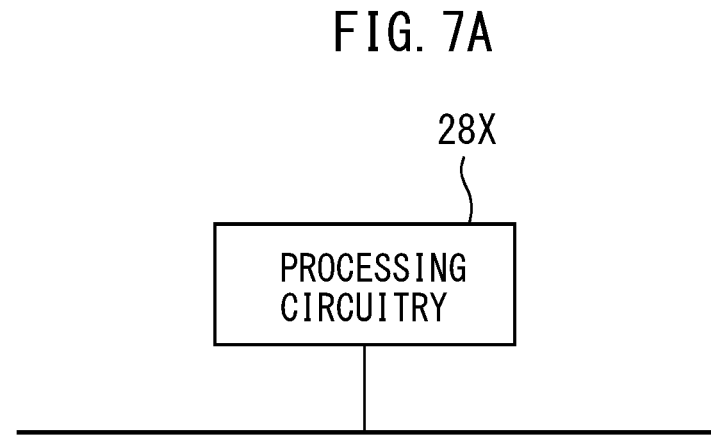
FIG. 7A is a diagram illustrating a processing circuitry when the processing circuit is the dedicated hardware circuit.
Figure 7B:
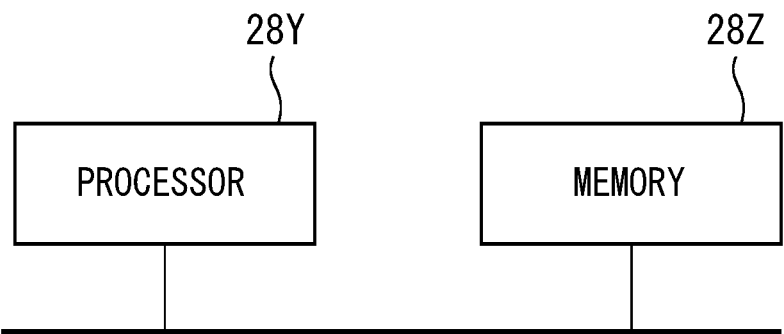
FIG. 7B shows a configuration example of the controller in the case where the processing circuit is a CPU.

FIGS. 7A and 7B are diagrams showing configuration examples of the controller 28. The controller 28 has a processing circuit. Each of the above-described functions, which is performed in the controller 28, is realized by the processing circuit. Specifically, due to the processing circuit, the controller moves the substrate support stage in the chamber up and down, and open and close the gate valve provided in the chamber in the state in which no substrate is present in the chamber, after an idle state of the chamber. Then, the processing circuit repeats such operations a plurality of times as to transport the substrate into the chamber, treat the substrate, and extract the substrate to the outside of the chamber.

The processing circuit may be provided as dedicated hardware (dedicated circuit), or may be a CPU (a central processing unit, a processing device, an arithmetic device, a microprocessor, a microcomputer, a processor, or a DSP) which executes a program stored in a memory.

FIG. 7A is a diagram illustrating a processing circuit 28X when the processing circuit is the dedicated hardware (dedicated circuit). The processing circuit 28X corresponds to, for example, a single circuit, a composite circuit, a programmed processor, a parallel programmed processor, an ASIC, an FPGA, or a combination thereof. Each of the processes to be performed by the controller may be realized by a separate processing circuit, or may be realized collectively by a processing circuit.

FIG. 7B shows a configuration example of the controller 28 in the case where the processing circuit is a CPU. In this case, each of the functions of the controller 28 is realized by software or a combination of software and firmware. The software or the firmware is described as a program, and is stored in a memory 28Z. A processor 28Y reads out and executes the program stored in the memory 28Z, and thereby realizes each of the functions. In other words, the controller includes the memory 28Z that stores the program which results in executing each of the above-described steps, when the program is executed by the processing circuit. It can also be said that these programs cause the computer to execute procedures and methods of the steps S1 to S6 and S41 to S45. Here, the memory corresponds to, for example, a nonvolatile or volatile semiconductor memory such as a RAM, a ROM, a flash memory, an EPROM and an EEPROM; a magnetic disk; a flexible disk; an optical disk; a compact disk; a mini disk; or a DVD. As a matter of course, it is also acceptable to realize a part of each of the above functions by hardware, and realize a part of the functions by software or firmware.

In this way, each of the above-described functions is executed by execution of the program stored in the memory by the processor, or by processing of a dedicated circuit. The controller 28 functions as a chamber state controller which controls the state of the chamber.

Figure 8:
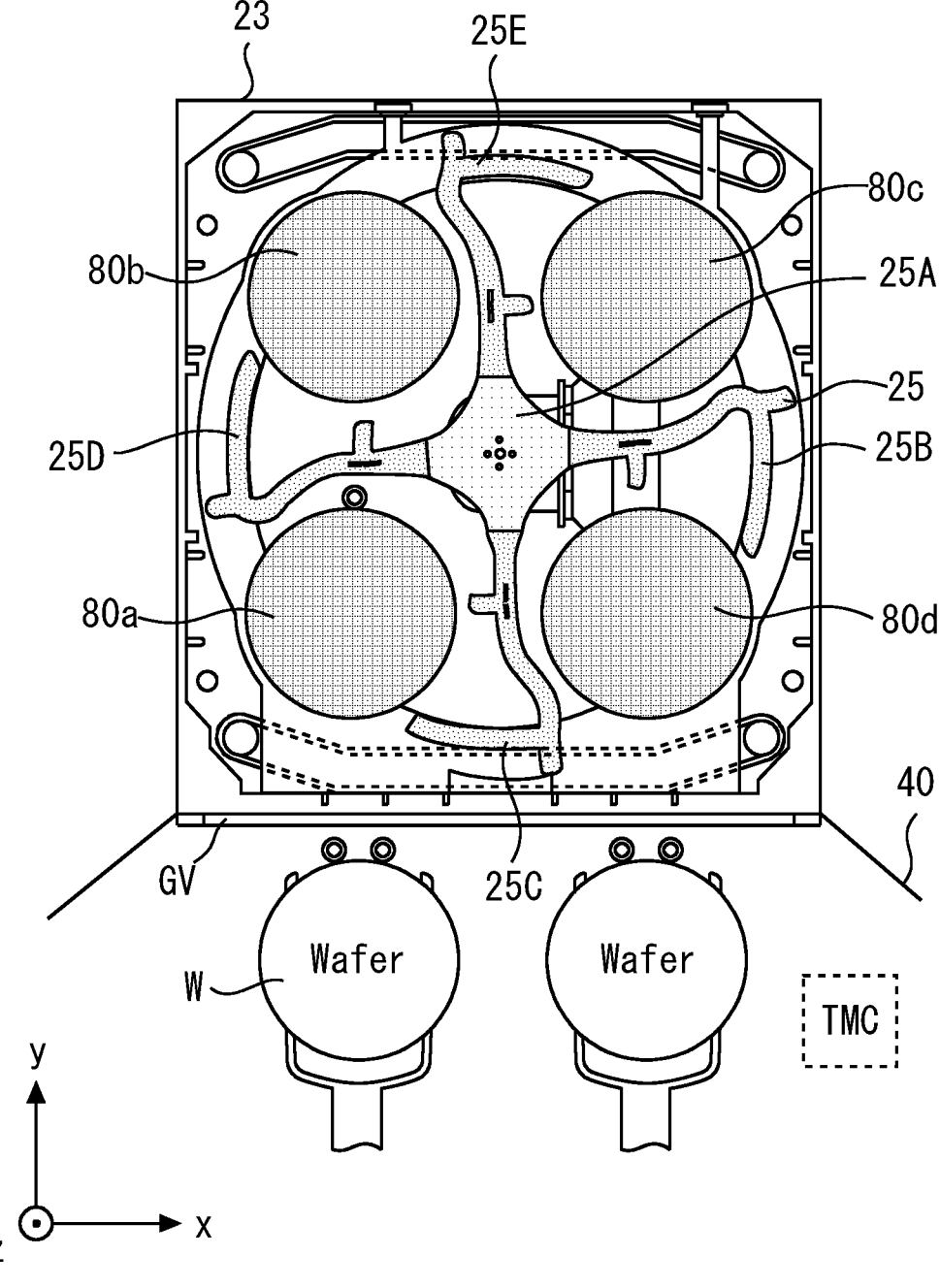
FIG. 8 shows another example of a substrate treatment apparatus.

FIG. 8 is a diagram showing a substrate treatment apparatus according to a modified example. This substrate treatment apparatus includes a QCM 23 that is in contact with the WHC 40 and has four chambers. The substrate treatment apparatus includes substrate support stages 80a, 80b, 80c and 80d which can be moved up and down. The substrate treatment apparatus further includes a rotation arm 25 provided in the QCM 23. The rotation arm 25 includes a shaft 25A, and arms 25B, 25C, 25D and 25E which are attached to the shaft 20A. The rotation arms 25B, 25C, 25D and 25E rotate around the shaft 25A, and can move the substrate in the QCM. In the above-described example, the controller executes the VDW to thereby move the substrate support stage up and down, and open and close the gate valve. In addition to such an operation of the VDW, the substrate treatment apparatus of FIG. 8 rotates and moves up and down the rotation arm 25 before the next substrate treatment is performed in the chamber, as a part of the function of the VDW. According to one example, the substrate treatment apparatus can rotate and move the rotation arm 25 up and down, in the same way as the movement of the rotation arm associated with the next substrate treatment. When the VDW is executed, the rotation arm is moved, which makes it possible to bring the state of the chamber close to the state of the chamber at the time of the process.

Figure 9:
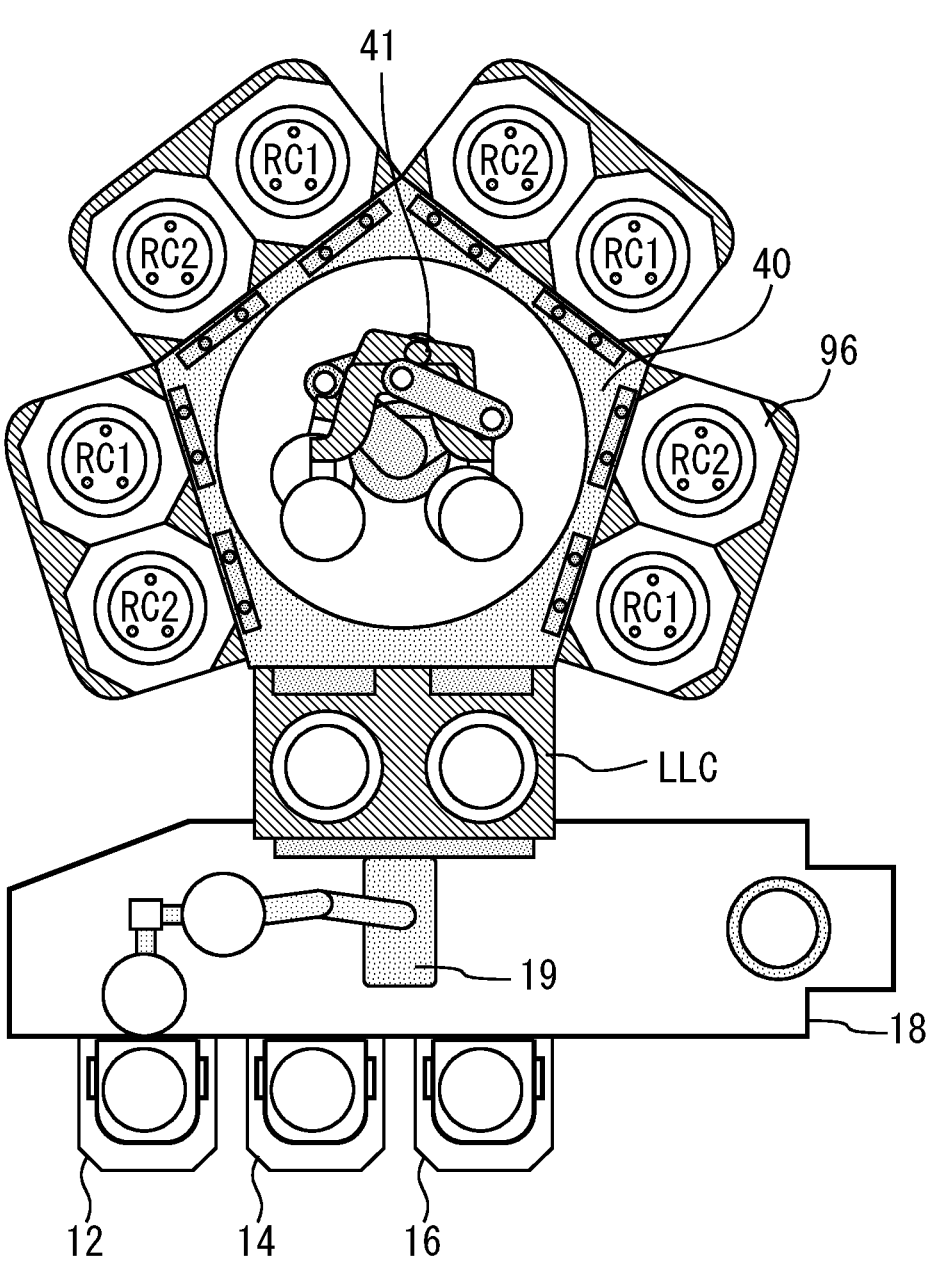
FIG. 9 shows another example of a substrate treatment apparatus.

FIG. 9 is a substrate treatment apparatus according to another modified example. The substrate treatment apparatus includes four DCMs 96 that is in contact with the WHC 40 and has two chambers. Also in such a DCM 96, the above-described effect can be obtained by the function of the VDW, which moves the substrate support stage and opens and closes the gate valve.

The invention claimed is:

1. A substrate treatment apparatus comprising:
   a chamber;
   a substrate support stage located inside the chamber, the substrate support stage configured to move up and down;
   a gate valve provided between the chamber and an adjacent chamber that is adjacent to the chamber; and
   a chamber state controller including a processor and a memory configured to cause the processor to execute a program stored in the memory, or including a dedicated circuitry, to:
      move the substrate support stage and the gate valve before a next substrate treatment is performed in the chamber, in a state in which no substrate is present in the chamber;
      execute a dummy pre-recipe, a dummy main recipe and a dummy post-recipe that have the same contents as those of a pre-recipe, a main recipe and a post-recipe, wherein the dummy pre-recipe, the dummy main recipe, and the dummy post-recipe are carried out before the next substrate treatment is performed in the chamber and in the state in which no substrate is present in the chamber, and wherein the pre-recipe, the main recipe, and the post-recipe are used in the next substrate treatment, and execute an operation of moving the substrate support stage and moving the gate valve in the state in which no substrate is present in the chamber is performed between processes of the dummy pre-recipe and the dummy main recipe, and between processes of the dummy main recipe and the dummy post-recipe.

2. The substrate treatment apparatus according to claim 1, wherein when an idle state in which the substrate is not treated in the chamber exceeds a predetermined period, the chamber state controller moves the substrate support stage and moves the gate valve, in the state in which no substrate is present in the chamber.

3. The substrate treatment apparatus according to claim 1, wherein the chamber state controller moves the substrate support stage and moves the gate valve, in the same way as the movement of the substrate support stage associated with the next substrate treatment and the movement of the gate valve associated with the next substrate treatment, in the state in which no substrate is present in the chamber.

4. The substrate treatment apparatus according to claim 1, wherein the chamber state controller executes an operation of moving the substrate support stage and moving the gate valve a plurality of times, in the state in which no substrate is present in the chamber.

5. The substrate treatment apparatus according to claim 1, further comprising a wafer transport robot in the adjacent chamber, wherein
the chamber state controller prohibits the wafer transport robot from moving in a state in which no substrate is carried by the wafer transfer robot, when moving the substrate support stage and moving the gate valve, in the state in which no substrate is present in the chamber.

6. The substrate treatment apparatus according to claim 1, further comprising: a QCM that has four chambers, where the chamber is one of constituent elements; and a rotation arm provided in the QCM, wherein
the chamber state controller rotates and moves the rotation arm up and down, before the next substrate treatment is performed in the chamber.

7. The substrate treatment apparatus according to claim 6, wherein the chamber state controller rotates and moves the rotation arm up and down, in the same way as the movement of the rotation arm associated with the next substrate treatment, before the next substrate treatment is performed in the chamber.

8. The substrate treatment apparatus according to claim 1, wherein
the pre-recipe is a recipe for performing pre-coating treatment or cleaning treatment, and
the post-recipe is a recipe for performing cleaning treatment or a process for temperature maintenance.

9. The substrate treatment apparatus according to claim 1, wherein the main recipe is a recipe for forming an epitaxial film on a substrate.

10. The substrate treatment apparatus according to claim 9, further comprising a heater for raising a temperature in the chamber.

11. The substrate treatment apparatus according to claim 1, wherein the main recipe is a recipe for subjecting the substrate to PECVD, PEALD or thermal ALD.

12. The substrate treatment apparatus according to claim 11, further comprising a stage heater that raises a temperature of the substrate support stage.

* * * * *